United States Patent [19]
Jamison

[11] Patent Number: 4,728,022
[45] Date of Patent: Mar. 1, 1988

[54] MASK AND SOLDER FORM

[75] Inventor: John W. Jamison, Palm Springs, Calif.

[73] Assignee: Hughes Aircraft Company, Los Angeles, Calif.

[21] Appl. No.: 909,756

[22] Filed: Sep. 19, 1986

[51] Int. Cl.$^4$ ............................................. B23K 3/00
[52] U.S. Cl. ................................. 228/56.3; 228/180.2
[58] Field of Search .................... 228/56.3, 6.2, 180.2, 228/215

[56] References Cited

U.S. PATENT DOCUMENTS

| | | | |
|---|---|---|---|
| 3,392,899 | 7/1968 | Hoogstoel | 228/56.3 |
| 3,464,617 | 9/1969 | Raynes | 228/56.3 |
| 3,646,670 | 3/1972 | Yo Maeda | 228/180.2 |
| 3,689,336 | 9/1972 | Bunker | 228/180.2 |
| 3,781,596 | 12/1973 | Galli | 228/180.2 |
| 4,354,629 | 10/1982 | Grassauer | 228/56.3 |

FOREIGN PATENT DOCUMENTS 0133752 3/1985 European Pat. Off. ............ 228/56.3

OTHER PUBLICATIONS

Technology Review of *Computer Design*, Nov. 1980, p. 108.
Production Soldering Clinic of *Insulation Circuits*, Oct. 1980.

*Primary Examiner*—Kurt Rowan
*Attorney, Agent, or Firm*—Thomas A. Runk; Anthony W. Karambelas

[57] ABSTRACT

A mask and solder form for mounting of multi-leaded integrated circuit carriers to printed wiring boards during a soldering process is disclosed. The form comprises a multi-layer composite frame-like structure. The top layer is a translucent sheet, and is provided with a solder and flux strip. The top layer is bonded to a divider layer which is slotted to accept the multi-wire leads of the circuit carrier. The bottom surface of the divider layer is coated with adhesive. The transparent top layer permits precise alignment of the leads of the carrier and the printed wiring board lines. The divider layer blocks the flow of molten solder between leads by providing each wire with its own individual slot. The form is well suited to production loading of the circuit carriers on the printed wiring boards for vapor phase soldering.

9 Claims, 6 Drawing Figures

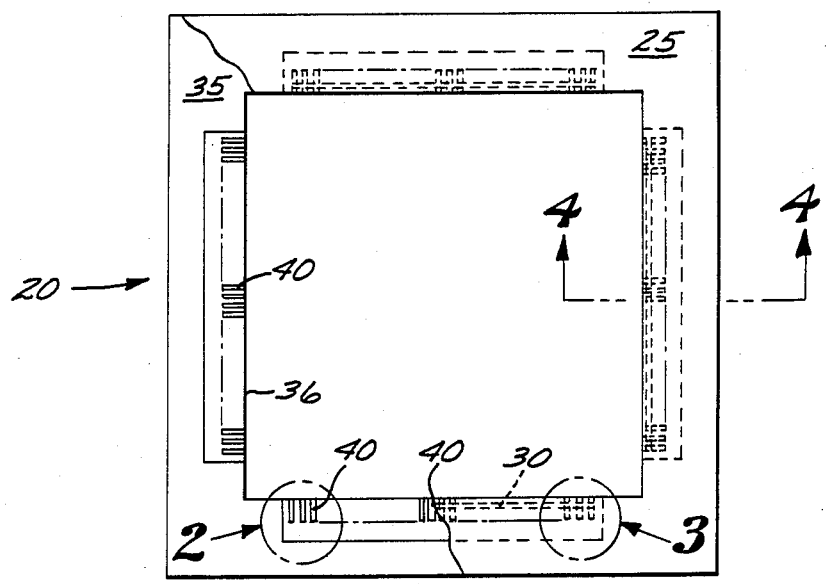

MASK AND SOLDER FORM

BACKGROUND OF THE INVENTION

This invention relates to the mounting of multi-leaded integrated circuit carriers to printed wire boards (PWBs), and more particularly to a technique for mounting such carriers to PWBs using a mask and solder form to firmly hold the multi-leaded carrier during the soldering process against the wires printed on the PWB, apply the precise amount of solder and flux to each wire and prevent the solder from flowing between adjacent leads.

Leaded integrated circuit carriers have come into common use to provide a means of physically and electrically coupling integrated circuits to PWBs. The fine wire leads of such carriers are typically spaced 0.020 inches center-to-center for wire leads which are 0.005 inches to 0.010 inches in diameter. The close spacing of the leads creates problems in soldering the leads to the printed wires of the PWB without inadvertently having solder flow between adjacent wire leads and thereby short the leads together.

Raychem Corporation, Menlo Park, Calif., markets a product under the name "Solder Quik tapes" used for such purposes as soldering multi-wire cables to printed circuit cards. Applicant is unaware of any application of such tape products for soldering leaded integrated circuit carriers to PWBs prior to his invention.

It would therefore represent an advance in the art to provide a means for reliably holding the leads of a leaded carrier against the printed lines of the PWB and applying the precise amount of solder and flux to each lead needed during the soldering process.

SUMMARY OF THE INVENTION

These and other advantages and features are provided by a mask and solder form, comprising a multi-layer apparatus which provides a solder mask pattern for masking the individual leads, provides predetermined amounts of solder to each lead and which is secured to the PWB during the soldering process to secure the leads in correspondence with wires printed on the PWB.

In a preferred embodiment, the apparatus comprises a frame which fits about the periphery of a multi-leaded integrated circuit carrier. The frame comprises a top layer comprising a translucent solder form sheet. A strip of solder and flux is applied along the lower surface of the layer along its interior edge. An adhesive coats the lower surface of the top layer.

The apparatus further includes a divider layer which is secured to the lower surface of the top layer by the adhesive coating this lower surface. A plurality of slots opening into the interior edge of the frame is formed in the divider layer in correspondence with the lead pattern of the carrier device. The slots define individual lead compartments when the apparatus is in place on a PWB, forming a solder mask which prevents molten solder from flowing between adjacent leads during the soldering process. The lower surface of the divider layer is coated with pressure adhesive.

The top layer and divider layers are each fabricated from a material capable of withstanding the elevated temperatures associated with the soldering process. A protective storage sheet is applied against the lower surface of the divider layer, and is removed prior to use.

The apparatus is disposed about the periphery of the carrier device with the leads aligned in corresponding slots of the divider sheet. The form, with the leads engaged in the respective slots and adhered by the adhesive on the lower layer of top layer, is then pressed against the surface of the PWB, the translucency of the top layer allowing the leads to be visually aligned with corresponding printed wires on the PWB. The pressure adhesive coating the lower surface of the divider sheet secures the form and the carrier leads in place on the PWB for the solder processing.

During the soldering process, the solder is heated to flow between the respective leads and its corresponding printed wire on the PWB. The slotted divider sheet prevents the molten solder from flowing between adjacent wires. After the soldering process is completed, the mask and solder form is stripped from the PWB and discarded.

BRIEF DESCRIPTION OF THE DRAWINGS

These and other features and advantages of the present invention will become more apparent from the following detailed description of an exemplary embodiment thereof, as illustrated in the accompanying drawings, in which:

FIG. 1 is a top partially broken-away plan view of a mask and solder form embodying the invention.

FIG. 2 is an enlarged top view of a portion of the mask and solder form enclosed within phantom circle 2 of FIG. 1.

FIG. 3 is an enlarged top view of a portion of the mask and solder form enclosed within phantom circle 3 of FIG. 1.

FIG. 4 is an enlarged exploded view of the form shown in FIG. 1, taken along line 4—4.

DETAILED DESCRIPTON OF THE DISCLOSURE

Figure 5:
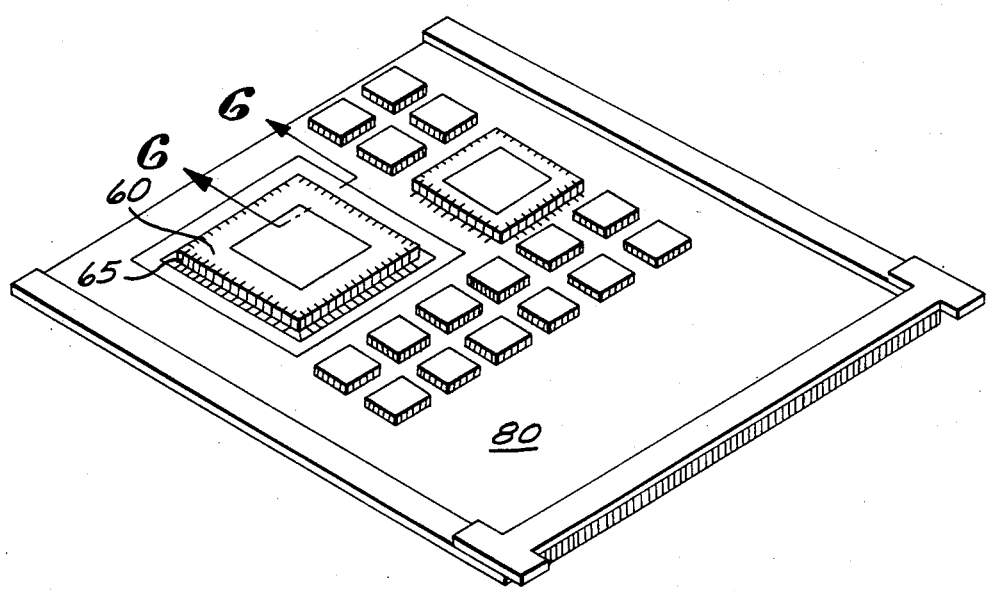
FIG. 5 is a simplified perspective view of a printed wiring board having a leaded integrated circuit carrier retained in position by a mask and solder form in accordance with the present invention.

The preferred embodiment of the invention is in the form of a mask and solder form 20 as depicted in FIGS. 1-4. This embodiment is adapted for use with leaded integrated circuit carrier devices having a plurality of closely spaced leads extending from a plurality of sides of the carrier. A typical carrier device has a rectilinear footprint with the leads extending from the four sides of the rectangle. In one exemplary type of carrier device, the leads have a center-to-center spacing of about 0.020 inches, with the typical lead diameter in the range of 0.005 to 0.010 inches. For a 1.5 inch square carrier device, there may be 64 leads extending from each of the four sides of the device.

Referring to FIG. 1, the form 20 comprises a frame which fits about the periphery of a device carrier with which the form 20 is to be used. The specific shape and dimensions of the form 20 are adapted to fit the particular peripheral configuration of the particular leaded carrier with which the form is to be used. In this embodiment, form 20 comprises a multi-layer structure. The top layer 25 comprises a sheet of flexible translucent material capable of withstanding the high temperatures of the soldering process, such as a polyimide. An example of a material for sheet 25 in marketed under the name "Kapton" by E.I. Dupont Company.

As shown in FIGS. 1, 3 and 4, a solder strip 30 is coated on the lower side of the sheet 25 adjacent the interior edge of the form 20. The thickness of the strip 30 in this embodiment is between 0.004 to 0.008 inches, and its width is approximately 1/16 inch. A thin layer 32 of suitable flux paste in turn coats the solder strip 30. A layer of adhesive 27 is also coated on the lower side of the sheet 25.

The form 20 further comprises a divider sheet 35 which is also formed from a material capable of withstanding the high temperatures of the soldering process, such as Kapton. As shown in FIGS. 1-3, a plurality of closely aligned slots 40 are formed in sheet 35 along the inner edge 36 thereof and generally perpendicular thereto. The thickness of the divider sheet 35 is determined in cooperation with the thickness of the leads of the carrier with which the form is to be used. By way of example, if the leads have a thickness of 0.005 inches, then a typical thickness of divider layer 35 is 0.005 to 0.010 inches. Similarly, the width of each slot is dependent on the diameter of the carrier device leads. Each slot should be wide enough to accept the lead and allow molten solder to flow down the sides of the slot around the lead. For some applications, providing a slot width large enough to allow a 0.003 to 0.004 inch gap on each side of the lead will be satisfactory. The lateral extent L of the slots 40 is selected to be long enough to accept the laterally extending portions of the soldered leads. Typically, the leads of the carrier will be trimmed appropriately.

A layer 45 of pressure adhesive coats the lower surface of the divider sheet 35.

The upper sheet 25 and divider sheet 35 are sandwiched together so that the adhesive layer 27 secures the two sheets together, with the solder strip 30 disposed above and along the inner edge of the form 20 above the slots 40.

The form 20 further comprises a flexible storage sheet 50 which can be a polyester material, such as that marketed under the name "Mylar" by E.I. Dupont Company. This sheet 50 is removably secured to the lower surface of the divider sheet 35 by the pressure adhesive 45. The purpose of the storage sheet 50 is to protect the lower surface of the adhesive-backed divider sheet 35 from damage during storage of the form 20. The storage sheet 50 is removed from sheet 35 to use the form 20.

Figure 6:
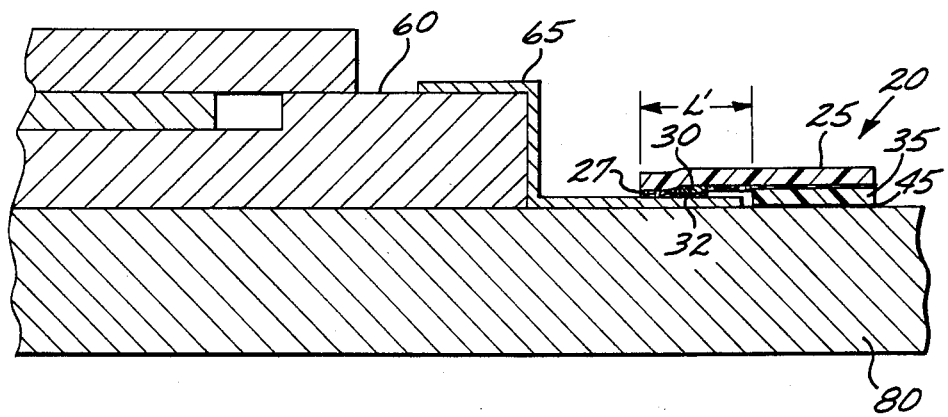
FIG. 6 is an enlarged cross-sectional veiw taken along line 6—6 of FIG. 5, showing the mask and solder form in position relative to the PWB and device carrier.

FIGS. 5 and 6 illustrate the use of the disclosed embodiment of the form 20 with an exemplary leaded integrated circuit carrier 60. As illustrated, the carrier 60 comprises a square, relatively flat member, with a plurality of closely spaced leads 65 extending from each of the four sides of the carrier. As is well known to those skilled in the art, one or more integrated circuit chips are bonded to an interior surface of the carrier, and connection is made to the electrical terminal pads of the circuit chip from a wire pattern formed on the carrier 60. The leads 65 protruding from the carrier 60 thus serve to provide electrical connections to the integrated circuit chip bonded to the carrier 60.

The wire leads 65 of carrier 60 are to be soldered to corresponding printed wires on the PWB 80. The mask and solder form 20 is used to retain the leaded chip carrier 60 in the appropriate position on the surface of PWB 80 and to distribute solder in specific amounts at specific areas during the soldering process. The form 20 is first secured into position in relation to the carrier 60, with the leads 65 being aligned on the slots 40. Because the sheet 25 is translucent, the slots 40 of form 20 may be visually aligned with the leads of the carrier 60. The portion of the adhesive layer 27 disposed above the slots 40 secures the leads in position in the corresponding slots 40.

The carrier 60 and form 20 are then placed in position on the PWB 80, with the wires 65 in alignment with the wire pattern printed on the PWB 80. Again, the translucency of layer 25 allows visual alignment of the wires 65 with the corresponding printed wire pattern on PWB 80. The alignment is retained by the pressure adhesive layer 45, such that the carrier 60 and form 20 are maintained in their respective aligned positions on the PWB 80.

The assembled configuration of the mask and solder form 20, the carrier 60 and PWB 80 is shown in the cross-sectional view of FIG. 6. Reference letter L' indicates the lateral extent of the slots 40 formed in divider layer 35.

The PWB 80 with the carrier 60 and form 20 is then passed through the soldering process, such as vapor phase soldering, wherein the solder strip 30 and flux paste 32 are transformed to the liquid or molten state. The solder and flux flow around the respective leads to the corresponding printed wire on the PWB 80. The form 20 supplies the appropriate amount of solder and flux at the appropriate areas to solder the leads to the corresponding printed wires on the PWB. The sheets 25 and 35 comprising the composite structure of the form 20 withstand the high temperature of the soldering process. The walls of divider sheet 35 defining the slots 40 block the flow of molten solder between leads by providing each wire with its own individual slot.

Once the solder process is completed, the form 20 may be stripped from the PWB and discarded.

It is understood that the above-described embodiment is merely illustrative of the possible specific embodiments which can represent principles of the present invention. Other arrangements may be devised in accordance with these principles by those skilled in the art without departing from the scope of the invention

What is claimed is:

1. A mask and solder form for securing a rectangular multi-leaded integrated circuit carrier device against corresponding printed lines on a printed wiring board during a soldering process, comprising:
   a rectangular frame structure adapted to enclose the periphery of the carrier device and engage against the leads of the carrier device, said structure comprising:
   a rectangular, open center top layer made of translucent polymer sheet material adapted to withstand the temperatures sustained during a soldering process, said open center being defined by an inner edge spaced wider than the carrier device, said top layer having a bottom surface;
   a solder strip disposed along the bottom surface of said top layer adjacent said inner edge and parallel to said inner edge;
   an adhesive layer under said solder strip and on the bottom surface of said top layer;
   a rectangular, open center divider layer adhesively attached under said top layer and under said solder strip, said divider layer having an inner edge substantially in alignment with said inner edge of said top layer, said divider layer comprising a sheet of polymer material adapted to withstand the temperatures sustained during the soldering process, said divider layer having a thickness at least equal to the thickness of the leads on the carrier device, said divider layer having walls defining a plurality of slots extending to said inner edge of said divider layer adjacent the periphery of the carrier device in visually confirmable spatial correspondence with the lead pattern of the carrier device, each of said slots being arranged to accept a corresponding lead; and a coating of pressure-sensitive adhesive applied to the lower surface of said divider layer to hold said mask and the carrier leads in place on the printed wiring board.

2. The mask and solder form on claim 1 further comprising a protective sheet releasably secured to said lower surface of said divider layer.

3. An apparatus for securing the leads of a multi-leaded circuit carrier device against the printed wire lines on a printed wire board for soldering, comprising:
a divider layer for positioning at the edge of the carrier device, said divider layer having an edge and having walls defining a plurality of slots extending to the edge of said divider layer for fitting over the leads and receiving the leads in the open ends of the individual segregated slots, said divider layer being at least as thick as the thickness of the leads;
a solder strip positioned on the top of said divider layer and extending across said slot for providing a predetermined amount of solder at each individual segregated slot;
a translucent cover layer over said divider layer and over said solder strip;
an adhesive under said cover layer and under said solder strip and over each said slot for releasably securing said leads in individual slots and visibly maintaining said slots in correspondence with the printed wiring lines during a solder process to allow said solder to flow between the respective leads and corresponding printed wire lines, said divider layer between said slots preventing the flow of molten solder between adjacent leads of said carrier device during soldering.

4. The apparatus of claim 3 wherein:
said cover layer of translucent material is adapted to withstand the temperatures sustained during soldering; and
said divider layer comprises a sheet material adapted to withstand the tempertures sustained during soldering.

5. The apparatus of claim 3 wherein said solder strip is disposed on said divider layer and above said slots so that, when in a molten state, solder may flow into said slots.

6. The apparatus of claim 4 further including an adhesive for releasably securing said apparatus to the surface of said printed wiring board comprises a layer of pressure-sensitive adhesive coating the lower surface of said divider layer.

7. The apparatus of claim 6 further comprising a protective sheet releasably secured to said lower surface of said divider layer.

8. The method of masking and soldering the lead on an integrated circuit carrier onto a corresponding printed line on a printed circuit board comprising the steps of:
forming a covered slot having a width suitable to receive the lead and to extend at least partway across the width of the printed line on the printed circuit board, having a length suitable to receive the line in the open end thereof and having a height at least as high as the thickness of the lead with solder in the slot, adhesive in the slot for retaining the lead in the slot, having adhesive on the bottom of the form for releasable attachment to the printed circuit board and a translucent covering over the slot comprising the steps of:
observing the lead through the translucent cover of the slot;
shifting the form with respect to the lead to visually align the lead with the slot;
attaching the lead into the slot by means of adhesive in the slot;
visually observing the position of the lead with the corresponding printed wire pattern;
aligning the lead with the corresponding printed wire pattern; and
attaching the form to be printed wiring board by means of the adhesive on the bottom of the form with the lead in alignment with the printed line on the printed wiring board.

9. The method of claim 8 further including the steps of heating the lead, solder and printed wiring board to soldering temperature for soldering attachment;
cooling the solder attachment; and
removing the form from the completed solder attachment.

* * * * *

UNITED STATES PATENT AND TRADEMARK OFFICE
CERTIFICATE OF CORRECTION

PATENT NO. : 4,728,022

DATED : March 1, 1988

INVENTOR(S) : J. W. Jamison

It is certified that error appears in the above-identified patent and that said Letters Patent is hereby corrected as shown below:

Column 5, line 16 (claim 2): replace "on" with --of--.

Column 6, line 41 (claim 8): replace "be" with --the--.

Signed and Sealed this

Twenty-eighth Day of February, 1989

Attest:

DONALD J. QUIGG

*Attesting Officer*     *Commissioner of Patents and Trademarks*